(12) United States Patent
Heo et al.

(10) Patent No.: US 11,469,180 B2
(45) Date of Patent: Oct. 11, 2022

(54) SEMICONDUCTOR DEVICE INCLUDING AN INSULATING MATERIAL LAYER WITH CONCAVE-CONVEX PORTIONS

(71) Applicant: SAMSUNG ELECTRONICS CO., LTD., Suwon-si (KR)

(72) Inventors: Junyeong Heo, Suwon-si (KR); Unbyoung Kang, Hwaseong-si (KR); Donghoon Won, Cheonan-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/886,444

(22) Filed: May 28, 2020

(65) Prior Publication Data

US 2021/0125925 A1    Apr. 29, 2021

(30) Foreign Application Priority Data

Oct. 28, 2019  (KR) .................. 10-2019-0134393

(51) Int. Cl.
| | | |
|---|---|---|
| *H01L 23/528* | (2006.01) | |
| *H01L 23/58* | (2006.01) | |
| *H01L 23/48* | (2006.01) | |
| *H01L 21/78* | (2006.01) | |
| *H01L 21/3065* | (2006.01) | |

(52) U.S. Cl.
CPC ...... *H01L 23/5283* (2013.01); *H01L 21/3065* (2013.01); *H01L 21/78* (2013.01); *H01L 23/481* (2013.01)

(58) Field of Classification Search
CPC . H01L 21/3065; H01L 21/78; H01L 23/5283; H01L 23/481
See application file for complete search history.

(56) References Cited

U.S. PATENT DOCUMENTS

| 5,201,987 A | 4/1993 | Hawkins et al. |
|---|---|---|
| 7,482,251 B1 * | 1/2009 | Paulsen ................. H01L 21/78 257/E21.237 |
| 8,383,436 B2 | 2/2013 | Arita |

(Continued)

FOREIGN PATENT DOCUMENTS

| JP | 2016-58577 A | 4/2016 |
|---|---|---|
| JP | 2016-58578 A | 4/2016 |

(Continued)

*Primary Examiner* — Herve-Louis Y Assouman
(74) *Attorney, Agent, or Firm* — Myers Bigel, P.A.

(57) ABSTRACT

A semiconductor device includes a semiconductor substrate having a first surface and a second surface opposing each other, and a side surface between the first and second surfaces, and including a device region on the first surface a wiring structure on the surface of the semiconductor substrate, and having a dielectric layer and a metal wiring in the dielectric layer and electrically connected to the device region, and an insulating material layer on a side surface of the wiring structure and having a side surface connected to the side surface of the semiconductor substrate. The side surface of the insulating material layer has a first wave-shaped pattern in which concave-convex portions are repeated in a direction of the wiring structure that is perpendicular to the semiconductor substrate, and the side surface of the semiconductor substrate has a second wave-shaped pattern in which concave-convex portions are repeated in the direction.

19 Claims, 10 Drawing Sheets

(56) References Cited

U.S. PATENT DOCUMENTS

| | | | |
|---|---|---|---|
| 8,871,614 B2 | 10/2014 | Kim et al. | |
| 9,666,677 B1 | 5/2017 | Raring et al. | |
| 2001/0015464 A1* | 8/2001 | Tamaki | H01L 21/823871 |
| | | | 257/393 |
| 2014/0175663 A1* | 6/2014 | Chen | H01L 23/49827 |
| | | | 257/774 |
| 2015/0228547 A1* | 8/2015 | Shih | H01L 23/481 |
| | | | 257/48 |
| 2018/0076088 A1 | 3/2018 | Sandoh | |
| 2018/0182670 A1* | 6/2018 | Abe | H01L 21/6836 |

FOREIGN PATENT DOCUMENTS

| | | |
|---|---|---|
| JP | 2017-73438 A | 4/2017 |
| JP | 2018-190858 A | 11/2018 |
| JP | 2019-87681 A | 6/2019 |
| JP | 2019-110272 A | 7/2019 |

* cited by examiner

SEMICONDUCTOR DEVICE INCLUDING AN INSULATING MATERIAL LAYER WITH CONCAVE-CONVEX PORTIONS

CROSS-REFERENCE TO RELATED APPLICATION(S)

This application claims benefit of priority to Korean Patent Application No. 10-2019-0134393 filed on Oct. 28, 2019 in the Korean Intellectual Property Office, the disclosure of which is incorporated herein by reference in its entirety.

BACKGROUND

The disclosure relates to a semiconductor device and a method of fabricating the same.

In general, a plurality of semiconductors may be fabricated by performing a series of semiconductor processes on a wafer and sawing the wafer.

For example, in the sawing process of the wafer, damage or contamination such as chipping, burring, or cracking may occur in the semiconductor device. For example, in the conventional blade sawing process, a chip breaking phenomenon such as cracking may occur due to limitations in mechanical processing. In a laser sawing process, there have been problems in which scattered debris falls onto a surface of the semiconductor device, thereby causing contamination of the semiconductor device.

SUMMARY

Some embodiments of the present disclosure provide a semiconductor device with reduced damage and contamination generated in a sawing process.

Some embodiments of the present disclosure provide a method of fabricating a semiconductor device that may reduce damage generated in a sawing process.

According to some embodiments of the present disclosure, a semiconductor device includes a semiconductor substrate having a first surface and a second surface opposing each other and a side surface between the first and second surfaces, and including a device region on the first surface of the semiconductor substrate, a wiring structure on the first surface of the semiconductor substrate, and having a dielectric layer and a metal wiring in the dielectric layer, such that the wiring structure is electrically connected to the device region, and an insulating material layer on a side surface of the wiring structure and having a side surface of the insulating material layer that is connected to the side surface of the semiconductor substrate. The side surface of the insulating material layer has a first wave-shaped pattern in which first concave-convex portions are repeated in a direction of the wiring structure that is perpendicular to the semiconductor substrate, and the side surface of the semiconductor substrate has a second wave-shaped pattern in which second concave-convex portions are repeated in the direction that is perpendicular to the semiconductor substrate.

According to some embodiments of the present disclosure, a semiconductor device includes a semiconductor substrate having a first surface and a second surface opposing each other, and including a device region on the first surface, a wiring structure on the first surface of the semiconductor substrate, and having a dielectric layer and a metal wiring in the dielectric layer, such that the wiring structure is electrically connected to the device region, and an insulating material layer on a side surface of the wiring structure and extending to an upper region of the side surface of the semiconductor substrate, such that the insulating layer has a substantially flat interface with the dielectric layer.

According to some embodiments of the present disclosure, a semiconductor device includes a semiconductor substrate having a first surface and a second surface opposing each other, and a side surface between the first and second surfaces, and including a device region on the first surface, a wiring structure on the first surface of the semiconductor substrate, and having a dielectric layer and a metal wiring in the dielectric layer, such that the wiring structure is electrically connected to the device region, and an insulating material layer on a side surface of the wiring structure and having a substantially flat interface with the dielectric layer. The side surface of the insulating material layer and the side surface of the semiconductor substrate have a wave-shaped pattern in which concave-convex portions are repeated in a direction that is perpendicular to the semiconductor substrate.

According to an aspect of the present disclosure, a method of fabricating the semiconductor device includes preparing a wafer having a semiconductor substrate having a plurality of device regions, a wiring structure having a dielectric layer on the semiconductor substrate and a metal wiring in the dielectric layer and electrically connected to the device region, and a scribe lane dividing the plurality of device regions, forming an isolation trench along the scribe lane in a portion of the wiring structure adjacent to the scribe lane, filling the isolation trench with an insulating material that can be removed by plasma etching to form an isolation structure, and performing a plasma etching process such that the isolation structure and the semiconductor substrate portion, corresponding to the isolation structure are removed.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
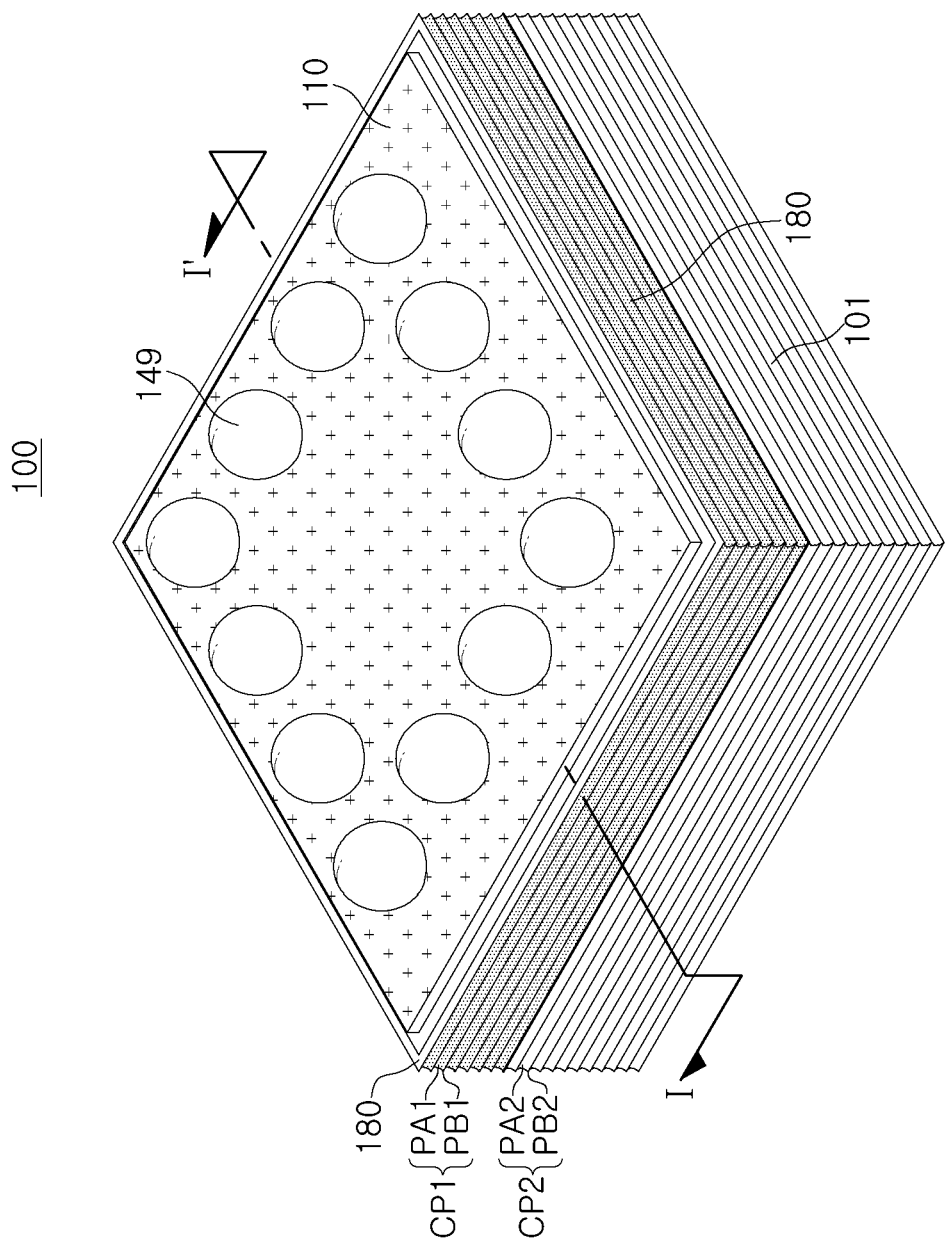
FIG. 1 is a perspective view illustrating a semiconductor device according to example embodiments of the present disclosure.
Figure 2:
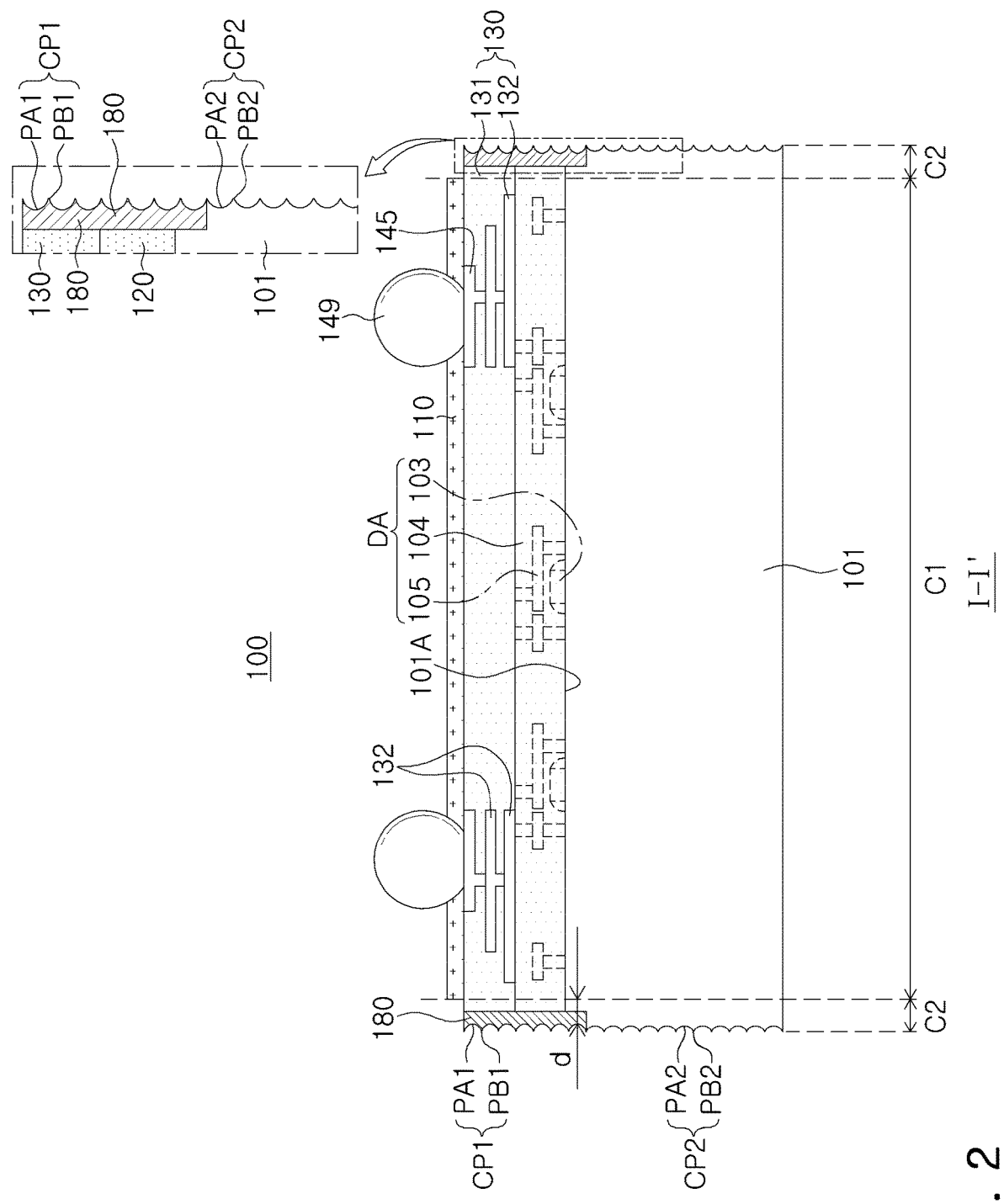
FIG. 2 is a partial cross-sectional view of the semiconductor device of FIG. 1 taken along line I-I'.

FIG. 1 is a perspective view illustrating a semiconductor device according to example embodiments of the present disclosure, and FIG. 2 is a partial cross-sectional view of the semiconductor device of FIG. 1 taken along line I-I'.

Referring to FIGS. 1 and 2, a semiconductor device 100 according to some embodiments may include a semiconductor substrate 101 having a device region DA on an upper surface thereof, and a wiring structure 130 disposed on an upper surface of the semiconductor substrate 101.

The device region DA may include an integrated circuit 103 and an interconnection portion 105 electrically connected to the integrated circuit 103. An interlayer insulating film 104 covering or overlapping the integrated circuit 103 and the interconnection portion 105 is formed on a first surface 101A of the semiconductor substrate 101. For example, the semiconductor substrate 101 may include a semiconductor such as Si or Ge, or a compound semiconductor such as SiGe, SiC, GaAs, InAs, or InP.

The wiring structure 130 may include a dielectric layer 131 disposed on the interlayer insulating film 104, and a metal wiring 132 disposed on the dielectric layer 131 and connected to the interconnection portion 105. The metal wiring 132 may be electrically connected to the integrated circuit 103 through the interconnection portion 105. As such, the wiring structure 130 may be electrically connected to at least portions of the device region DA such as the integrated circuit 103 and/or the interconnection portion 105.

For example, the interlayer insulating film 104 and/or the dielectric layer 131 may include a silicon oxide or an insulating material based on silicon oxide. For example, the interconnection portion 105 and/or the metal wiring 132 may include copper or a copper containing alloy. The metal wiring 132 may be formed using a dual-damascene process.

A passivation layer 110 may be disposed on the wiring structure 130. For example, the passivation layer 110 may include a silicon oxide or an insulating material based on silicon oxide. A connection pad 145 is disposed on an upper surface of the semiconductor device 100 to be connected to the metal wiring 132. A portion of the connection pad 145 may be exposed from the passivation layer 110, and may include a connection terminal 149 disposed in the exposed region of the connection pad 145. For example, the connection terminal 149 may have a solder ball, a bump, or a pillar shape.

The semiconductor device 100 may be divided into a first region C1 overlapping the device region DA and a second region C2 (also referred as an edge region) surrounding the first region C1 in a plan view. For example, a width of the second region C2 may be in a range of 5 μm to 30 μm.

The semiconductor device 100 includes an insulating material layer 180 disposed on a side surface of the wiring structure 130 in the second region C2. In the present example embodiment, the insulating material layer 180 may have a portion extending to an upper region of side surfaces of the semiconductor substrate 101.

The insulating material layer 180 may have an interface that is substantially coplanar with the dielectric layer 131. A side surface of the insulating material layer 180 disposed opposite to the interface may be connected to the side surface of the semiconductor substrate 101, which may be adjacent the side surface of the semiconductor device 110.

The side surface of the insulating material layer 180 may have a first wave-shaped pattern CP1. The first wave-shaped pattern CP1 may be a pattern in which a plurality of first concave portions PA1 and a plurality of first convex portions PB1 (also referred to as "first concave-convex portions") in a thickness direction of the wiring structure 130 that is perpendicular to the semiconductor substrate 101 are repeated at a relatively constant cycle.

Similarly, the side surface of the semiconductor substrate 101 may have a second wave-shaped pattern CP2. The second wave-shaped pattern CP2 may be a pattern in which a plurality of second concave portions PA1 and a plurality of second convex portions PA2 (also referred to as "second concave-convex portions") in a thickness direction of the semiconductor substrate 101 are repeated at a relatively constant cycle.

In some example embodiments, a repetition cycle of the concave-convex portions of the first wave-shaped pattern CP1 may be different from a repetition cycle of the concave-convex portions of the second wave-shaped pattern CP2. The difference may occur due to a change of conditions of the sawing process (e.g., plasma etching process) or a difference in an etching target material.

A portion of the passivation layer 110 located on the second region C2 may be removed. The removed portion may be a partial region (e.g., edge region) of the scribe lane remaining in the semiconductor device 100 after the sawing process.

A metal pattern (not shown) may exist in a portion of the wiring structure 130 located in the second region C2. The metal pattern (not shown) may include at least one of a Test Element Group (TEG), an alignment key, and a test wiring. Some metal patterns may be in contact with the insulating material layer 180.

The insulating material layer 180 may include a material that is usable for plasma etching. The insulating material layer 180 may include a material different from that of the dielectric layer 131. In some example embodiments, the material may be a material having higher plasma and reactivity than the material of the dielectric layer 131.

The insulating material layer 180 may include an insulating material having excellent gap fill characteristics. For example, the insulating material layer 180 may include a high density plasma (HDP) oxide film, TetraEthylOrthoSilicate (TEOS), Plasma Enhanced TetraEthylOrthoSilicate (PE-TEOS), O3-Tetra Ethyl Ortho Silicate (O3-TEOS), Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ), or a combination thereof. In addition, the insulating material layer 180 may be formed using a deposition technology having excellent step coverage. For example, the insulating material layer 180 may be formed by chemical vapor deposition (CVD) or spin coating.

Figure 3:
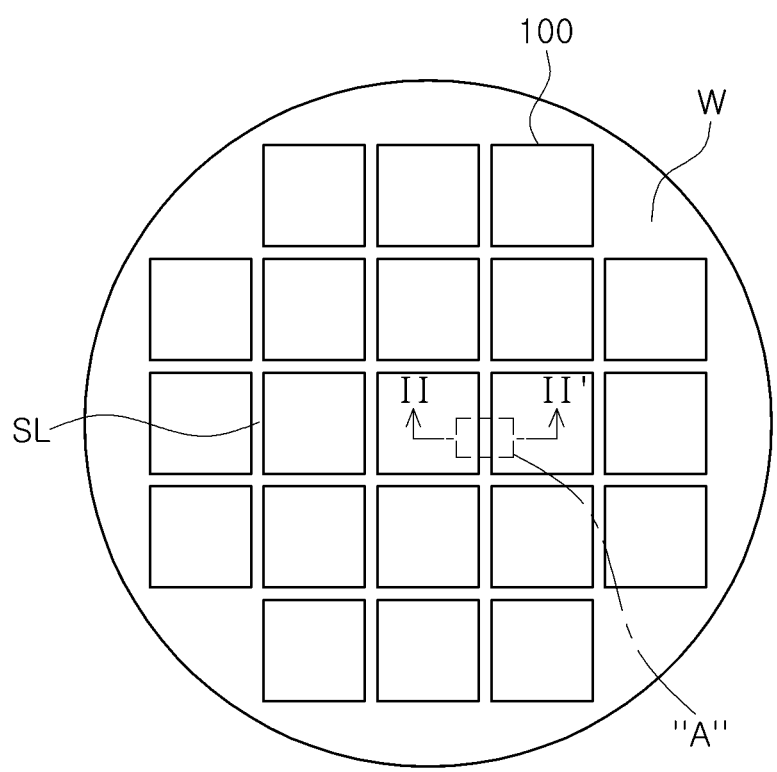
FIG. 3 is a plan view illustrating a wafer in which a plurality of semiconductor chips according to example embodiments of the present disclosure are implemented.
Figure 4:
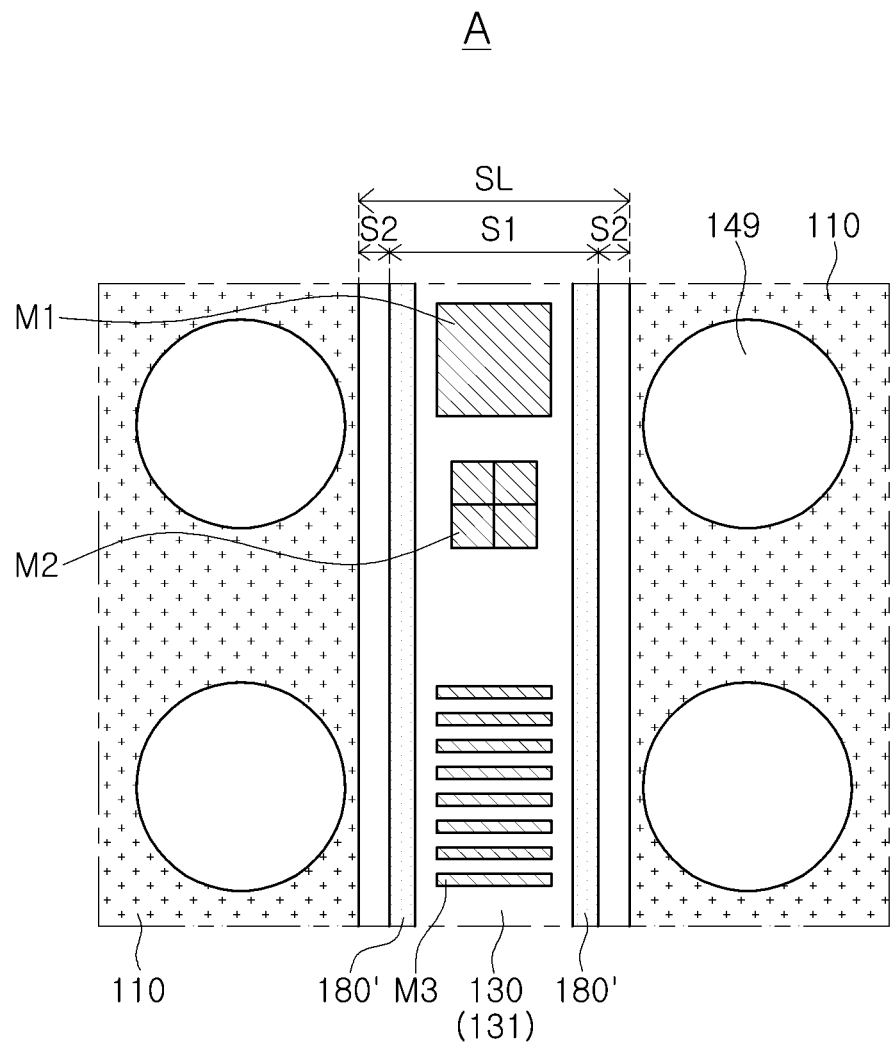
FIG. 4 is an enlarged plan view of a region A of the wafer of FIG. 3.

FIG. 3 is a plan view illustrating a wafer in which a plurality of semiconductor chips are implemented according to example embodiments of the present disclosure, and FIG. 4 is an enlarged plan view of a region A of the wafer of FIG. 3.

Referring to FIGS. 3 and 4, the wafer W may include a plurality of semiconductor devices arranged in a matrix shape and a scribe lane SL separating the plurality of semiconductor devices.

The semiconductor device 100 may be surrounded by a scribe lane CL in plan view, and the scribe lane SL may be provided as a dicing region for separating the semiconductor devices 100 formed on the wafer W.

As illustrated in FIG. 4, the scribe lane SL may be in a region from which an insulating protective layer 110 is removed. The scribe lane SL may include various metal patterns M1, M2, and M3 used for a semiconductor process or a packaging process as a free space of the wafer W. For example, the first metal pattern M1 may include a TEG, and the second and third metal patterns M2 and M3 may include an alignment key. Although not shown, the metal patterns may also include a wiring pattern for test (e.g., MP of FIG. 5), and the wiring pattern for test may be electrically connected to a metal wiring 132 of the wiring structure 130.

As described above, since the metal material does not respond to plasma etching, the metal patterns M1, M2, and M3 disposed in the scribe lane may interfere with the sawing process using the plasma etching. Therefore, it is possible to ensure a smooth sawing process by forming an isolation structure 180' that specifies an isolation region that is easily reacted by plasma in advance.

In some example embodiments, the isolation structure 180' may be formed by forming a trench in the scribe lane SL and in an extending direction thereof, and filling a nonmetallic material (e.g., insulating material) in the trench (see. FIGS. 5 to 8).

The scribe lane SL includes a removing region S1 removed in the sawing process and a buffer region S2 located on both sides of the removing region S1. The isolation structure 180' may be arranged in two rows in an extending direction of the scribe lane SL. The removing region S1 may be defined by the arrangement of the isolation structure 180'. The remaining buffer region S2 may be provided to the second region C2 of the semiconductor device 100 by removing the isolation structure 180'. For example, as illustrated in FIGS. 1 and 2, the cut semiconductor device 100 may include a first region C1 overlapping the device region DA and a second region C2 surrounding the device region DA, in a planar view, respectively.

FIGS. 5 to 8 are cross-sectional views of each main process illustrating a method of fabricating a semiconductor device according to some embodiments of the present disclosure. Here, the cross-sectional views of each process are cross-sectional views taken along the line II-II' of the wafer W of FIG. 3, and may be understood as a part of the wafer W for obtaining the semiconductor device 100 illustrated in FIG. 1.

Figure 5:
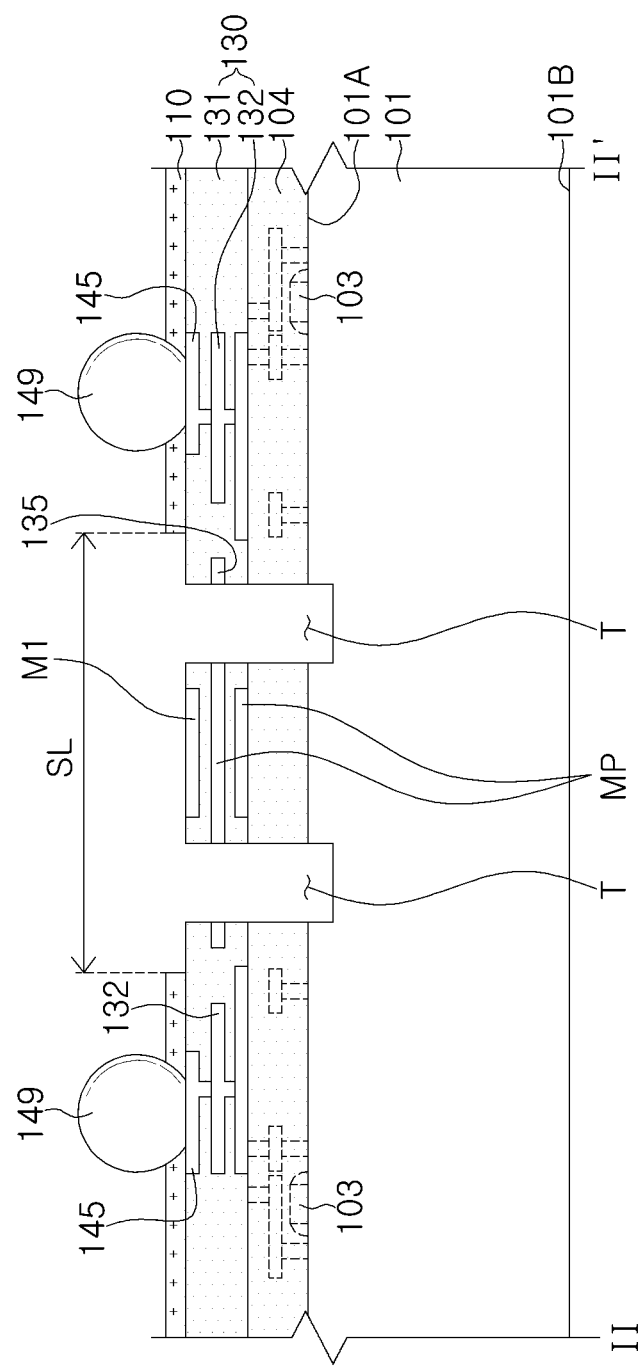
FIGS. 5 to 8 are cross-sectional views of main processes illustrating a method of fabricating a semiconductor device according to example embodiments of the present disclosure.

Referring to FIG. 5, a part of the wafer forming the plurality of semiconductor devices is illustrated.

A plurality of device regions DA are formed on the wafer, which is the semiconductor substrate 101, and a wiring structure 130 is formed on the plurality of device regions DA. The wiring structure 130 has a dielectric layer 131 and a metal wiring 132 located in the dielectric layer 131 and electrically connected to the device region DA.

A scribe lane SL for dividing the plurality of semiconductor devices may be defined on the wafer. A region to be removed after sawing may be defined by a position and/or a size of an isolation trench T. The isolation trench T employed in some example embodiments may include first and second isolation trenches adjacent to the device region DA located on both sides of the scribe lane SL, respectively, in a cross-section of the width direction of the scribe lane SL. The first and second isolation trenches may have a width of at least 10 µm in the width direction of the scribe lane SL, respectively.

The isolation trench T may penetrate through the wiring structure 130 to have a depth reaching the semiconductor substrate 101. In some example embodiments, the isolation trench T is configured in two rows, but in some embodiments, the isolation trench T may be configured in one row or three or more rows.

As described above, in the scribe lane SL, various metal patterns M1 and MP, such as a TEG, an alignment key, and/or a metal test wiring, may be located. The isolation trench T may be formed by removing some metal patterns. For example, since the wiring pattern MP for test is electrically connected to the metal wiring 132 of the wiring structure 130, the isolation trench T may be formed. As such, the metal pattern may be removed in advance in the region to be removed by plasma etching.

Figure 6:
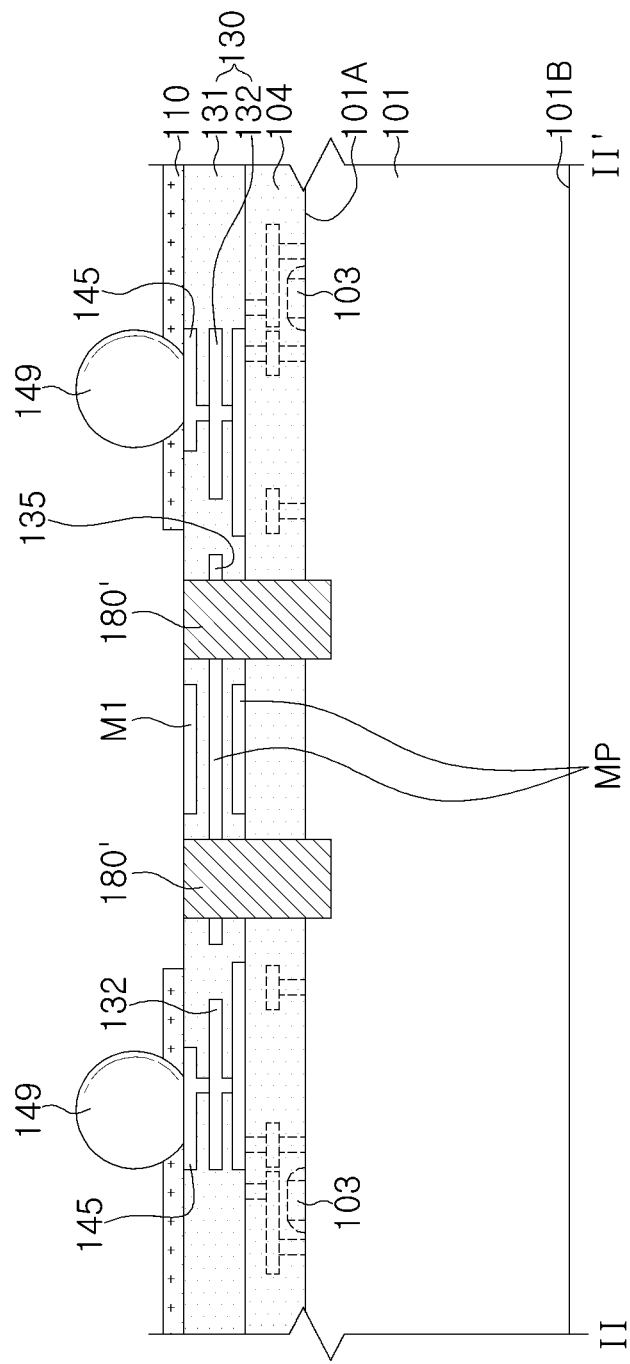

Next, referring to FIG. 6, the isolation trench T is filled with an insulating material that can be removed by plasma etching to form the isolation structure 180'.

The insulating material of the isolation structure 180' may include an insulating material having excellent gap fill properties. For example, the insulating material may include a high density plasma oxide film, TEOS, PE-TEOS, O3-TEOS, USG, PSG, BSG, BPSG, FSG, SOG, TOSZ, or a combination thereof. In addition, the insulating material may be formed by using deposition techniques having excellent step coverage. For example, filling of the isolation structure 180' may be performed by chemical vapor deposition (CVD) or spin coating. In some example embodiments, the insulating material may include a plasma etchable material. The insulating material may include a material different from that of the dielectric layer 131. In some example embodiments, the insulating material may be a material having greater reactivity with plasma than the material of the dielectric layer 131.

Figure 7:
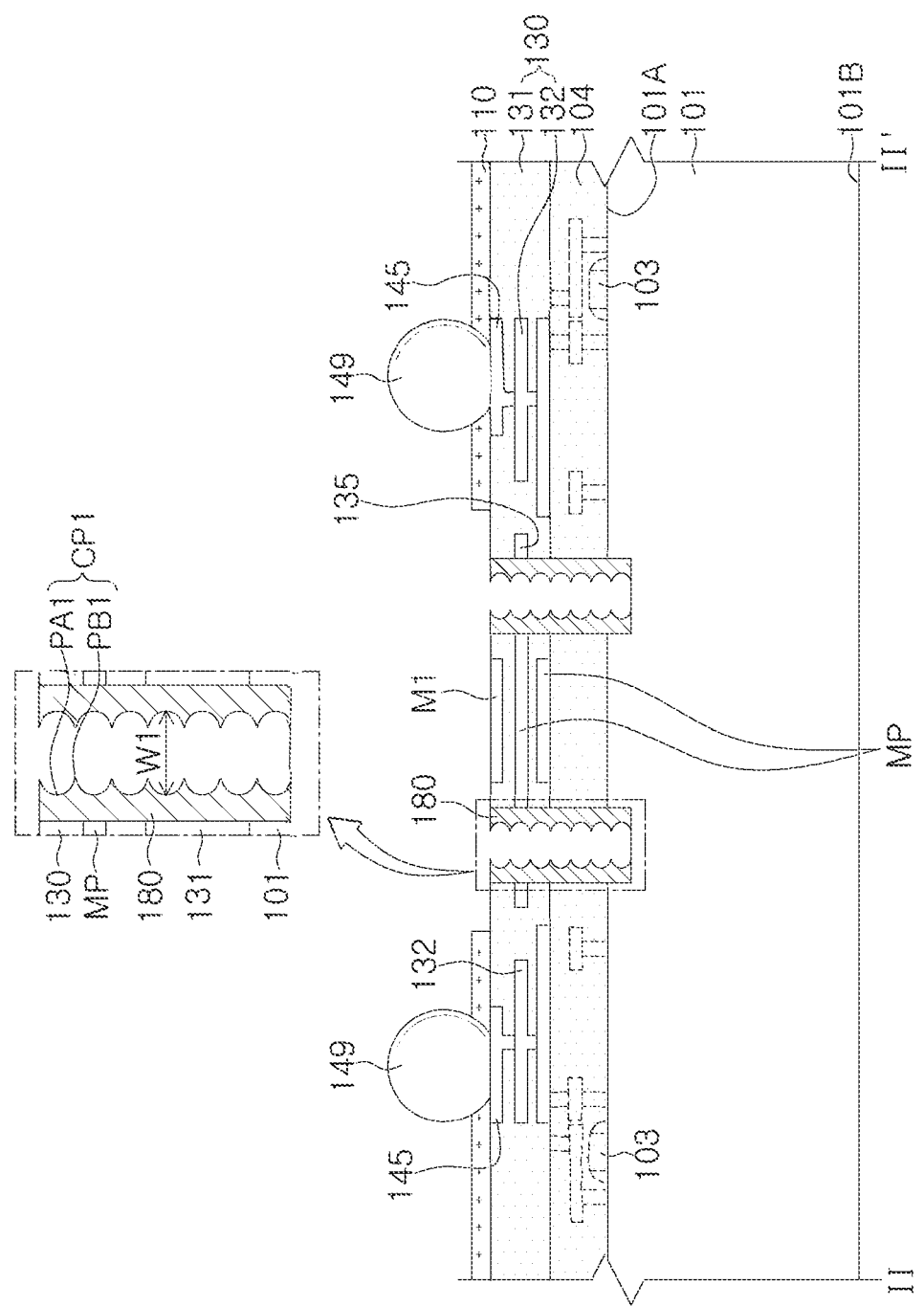

Next, referring to FIG. 7, a plasma etching process may be performed to remove the isolation structure 180'.

The plasma etching may be performed by a Bosch process. In general, the Bosch process may include one cycle of (1) isotropic etching, (2) protective film formation, and (3) removal of some protective film. The isolation structure 130 may be etched in a vertical direction by repeatedly performing the cycle while changing each step of the Bosch process at a high speed.

In some example embodiments, before performing the plasma etching process, a mask layer MA may be formed on a region corresponding to the device region DA of the wiring structure 130 to expose the isolation structure 180' of the scribe lane SL.

Figure 9A:
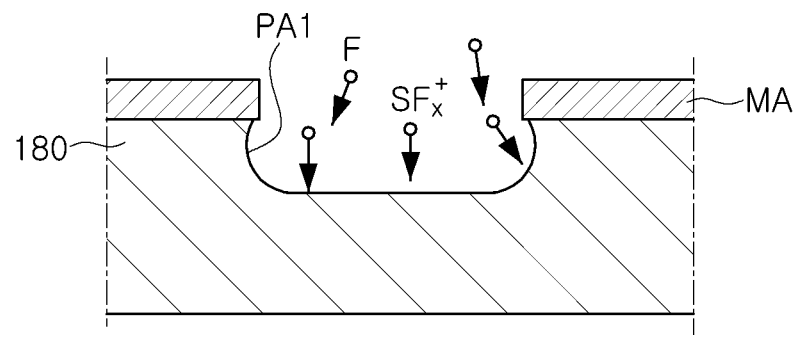
FIGS. 9A to 9C are cross-sectional views of main processes illustrating a sawing process using plasma according to example embodiments of the present disclosure.
Figure 9B:
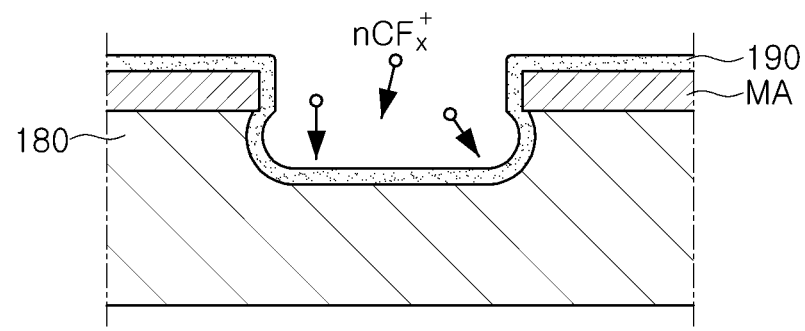
Figure 9C:
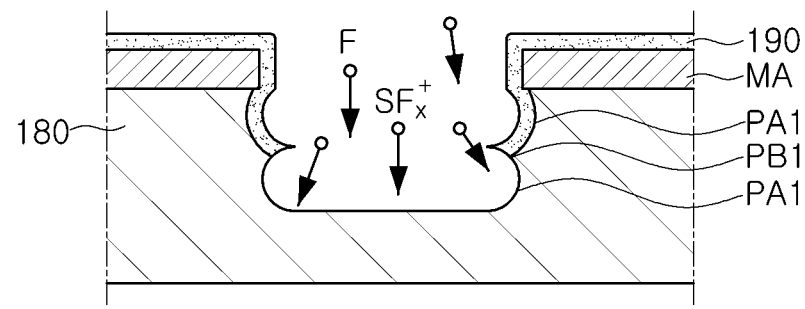

FIGS. 9A to 9C are cross-sectional views of main processes illustrating a sawing process (Bosch process) using plasma according to some example embodiments of the present disclosure.

Referring to FIG. 9A, $SF_x$(e.g., $SF_6$) gas may be used in an isotropic etching process, and the isolation structure 180 may be etched using radicals of the gas as reactive species. In this process, a first concave portion PA1, which is an etched region, is formed. A degree of side etching may be adjusted according to etching time.

Next, referring to FIG. 9B, after performing the isotropic etching process is performed for a short time (e.g., several seconds), it is changed as a protective film formation step. In the protective film formation step, an insulating protective film 190 such as a CF-based polymer may be formed on a side surface and a bottom surface of the etched region by decomposing $CF_x$(e.g., $C_4F_8$) gas in the plasma.

Next, referring to FIG. 9C, after removing a portion of the insulating protective film 190 disposed on the bottom surface using $SF_x$(e.g., $SF_6$) gas, the exposed portion of the isolation structure 180 may be isotropically etched to form an additional first concave portion PA1. Here, a protective film removing process may be performed in a state in which a high bias is applied to the semiconductor substrate 101. A protruded first convex portion PB1 may be located between the first concave portions PA1 adjacent by the present process.

By repeatedly performing the cycles of FIGS. 9A to 9C, as shown in FIG. 7, the isolation structure 180 may be partially removed and exposed to a portion of the semiconductor substrate 101.

By the plasma etching process, a side surface of the remaining isolation structure 180 (or also referred to as an insulating material layer) may have a first wave-shaped pattern CP1. The first wave-shaped pattern CP1 may be a pattern in which a plurality of first concave portions PA1 and a plurality of convex portions PN1 are periodically repeated in a thickness direction of the wiring structure 130. A repetition cycle or a width of concave-convex portions may be determined according to the above-described Bosch process cycle, isotropic etching time, and the like.

Figure 8:
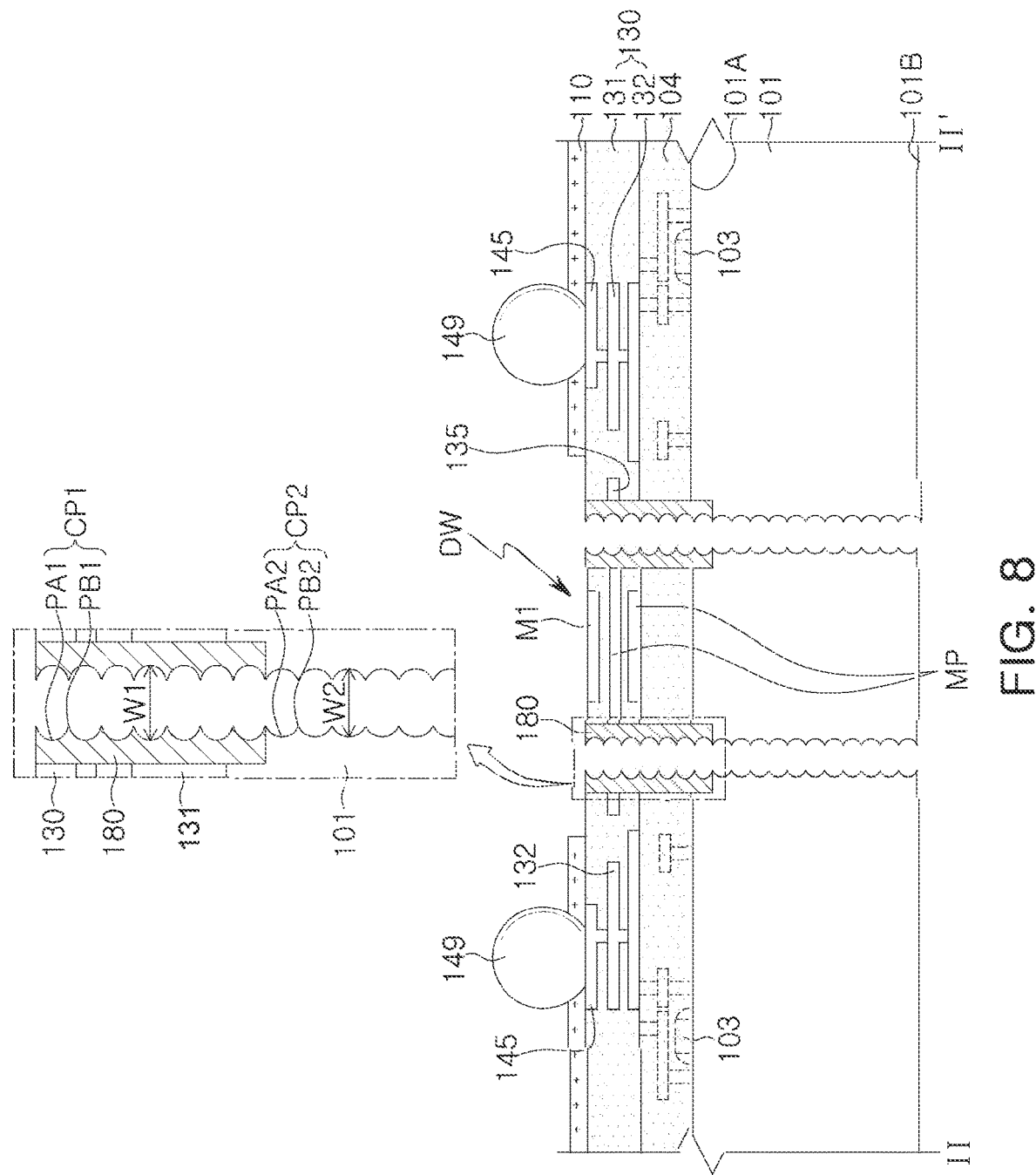

Next, referring to FIG. 8, a plasma etching process may be performed to remove a portion of the semiconductor substrate 101 corresponding to a removing region of the isolation structure 180'.

The plasma etching employed in the present process may be performed by a Bosch process similar to the above-described process. In some example embodiments, as described above, the semiconductor substrate 101 may be etched in the vertical direction by repeatedly performing the cycle of the Bosch process (see. FIGS. 9A to 9C). Therefore, the side surface of the semiconductor substrate 101 may have a second wave-shaped pattern CP2. The second wave-shaped pattern CP2 may be a pattern in which a plurality of second concave portions PA1 and a plurality of second convex portions PA2 are periodically repeated in a thickness direction of the semiconductor substrate 101. In some example embodiments, an entire side surface of the semiconductor substrate may have the second wave-shaped pattern CP2, but is not limited thereto.

In some example embodiments, a method may be employed in which the plasma etching may be performed such that a portion of a lower region of the semiconductor substrate 101 remains, and the remaining portion is physically sawed. In this case, a portion of the side surface of the semiconductor substrate 101, which is physically cut, may not have a wave-shaped formation pattern.

In some example embodiments, the repetition cycle of the concave-convex portion of the first wave-shaped pattern CP1 may be different from the repetition cycle of the concave-convex portion of the second wave-shaped pattern CP2. For example, even when the isolation structure and the semiconductor substrate 101 are cut under the same plasma etching process conditions, since the material to be etched is different, the widths W1 and W2 of the removed regions as well as the repetition cycles of the concave-convex portions may also be different from each other. Similar differences thereof may occur when the plasma etching process conditions are different.

In some example embodiments, an insulating protective film may remain on the side surfaces of the insulating material layer and the semiconductor substrate.

Figure 10:
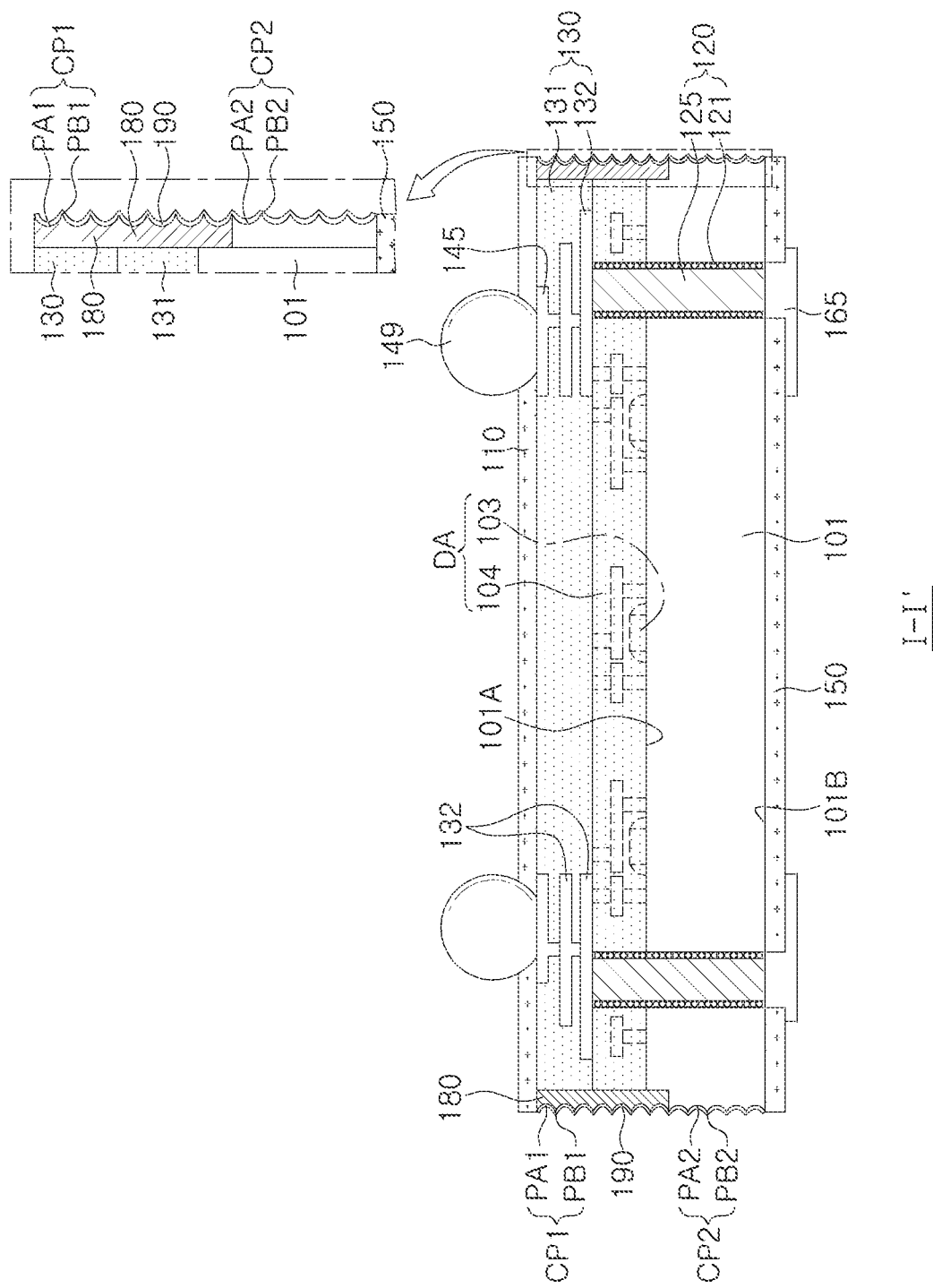
FIG. 10 is a cross-sectional view illustrating a semiconductor device according to example embodiments of the present disclosure.

FIG. 10 is a cross-sectional view illustrating a semiconductor device according to some example embodiments of the present disclosure.

Referring to FIG. 10, it can be understood that the semiconductor device according to some example embodiments has a similar structure as the semiconductor device 100 shown in FIGS. 1 and 2 except that the insulating protective film 190 is disposed on side surfaces of the insulating material layer 180 and the semiconductor substrate 101 and a through electrode 120 and a second connection pad 165 connected thereto are included. In addition, components of some example embodiments may be understood with reference to the descriptions of the same or similar components of the semiconductor device 100 illustrated in FIGS. 1 and 2 unless specifically stated otherwise.

An insulating protective film 190 may be disposed on the side surface of the semiconductor device 100. The insulating protective film 190 may be a CF-based polymer polymerized by passivation in the Bosch process. The insulating protective film 190 may be left on the insulating material layer 180 and the side surfaces of the semiconductor substrate 101 without being removed through a separate process.

In some example embodiments, a first passivation layer 110 may be disposed on an upper surface of the semiconductor device 100, that is, on the first wiring structure 130. A second passivation layer 150 may be disposed on a lower surface of the semiconductor device 100, that is, on a second surface 101B of the semiconductor substrate 101. For example, similar to the first passivation layer 110, the second passivation layer 150 may include a silicon oxide or an insulating material based on silicon oxide.

A first connection pad 145 connected to the metal wiring 132 of the wiring structure 130 may be disposed on the first passivation layer 110, and a second connection pad may be disposed on the second passivation layer 150. The second connection pad 165 may be connected to the device region DA through a through electrode 120 penetrating through the semiconductor substrate 101. The through electrode 120 may include a conductive material 125, and an insulating barrier 121 disposed between the conductive material 125 and the semiconductor substrate 101. For example, the conductive material 125 may include Cu, Co, Mo, Ru, W, or an alloy thereof. The insulating barrier 121 may include $SiO_2$, SiN, SiCN, SiC, SiCOH, SiON, $Al_2O_3$, AlN, or a porous material thereof.

The through electrode 120 may be electrically connected to the device area DA, such as the interconnection portion 105 and the integrated circuit 103, through the metal wiring 132 of the wiring structure 130. As a result, the second connection pad 165 may be electrically connected to the device area DA. In some example embodiments, a wiring structure, similar to the wiring structure 130 may also be disposed on the second surface 101B of the semiconductor substrate 101.

As set forth above, it is possible to provide a sawing process using plasma that minimizes or reduces mechanical damage and contamination that may occur in the conventional sawing process by proving an isolation structure in which a metal portion is removed in a scribe lane region in advance. As a result, it is possible to provide a semiconductor device having reduced damage and contamination in the sawing process.

Various and advantageous advantages and effects of the present inventive concept are not limited to the above description, and will be more readily understood in the process of describing the specific example embodiment of the present inventive concept.

While example embodiments have been shown and described above, it will be apparent to those skilled in the art that modifications and variations could be made without departing from the scope of the present inventive concept as defined by the appended claims.

What is claimed is:

1. A semiconductor device, comprising:
   a semiconductor substrate comprising a first surface and a second surface opposing each other, and a side surface between the first and second surfaces, wherein a device region is on the first surface of the semiconductor substrate;

a wiring structure on the first surface of the semiconductor substrate, and comprising a dielectric layer and a metal wiring in the dielectric layer, wherein the wiring structure is electrically connected to the device region; and an insulating material layer on a side surface of the wiring structure, and having a first side surface and a second side surface opposing each other, wherein the insulating material layer has a lower surface that is lower than the first surface of the semiconductor substrate and higher than the second surface the semiconductor substrate, wherein the first side surface of the insulating material layer has a first wave-shaped pattern which is repeated in a direction that is perpendicular to the first surface of the semiconductor substrate, wherein the side surface of the semiconductor substrate has a second wave-shaped pattern which is repeated in the direction that is perpendicular to the first surface of the semiconductor substrate, wherein the second side surface of the insulating material layer, which is substantially perpendicular to the first surface of the semiconductor substrate has a substantially flat interface with the dielectric layer of the wiring structure, and wherein the first side surface of the insulating material layer and the side surface of the semiconductor substrate are aligned in the direction that is perpendicular to the first surface of the semiconductor substrate.

2. The semiconductor device of claim 1, wherein a portion of the insulating material layer extends to an upper region of the side surface of the semiconductor substrate.

3. The semiconductor device of claim 1,
wherein the wiring structure comprises a first region overlapping the device region and a second region surrounding the first region in a plan view, and
wherein the wiring structure further comprises a metal pattern in the second region of the wiring structure.

4. The semiconductor device of claim 3, wherein the metal pattern is in physical contact with the insulating material layer.

5. The semiconductor device of claim 3, wherein the metal pattern is electrically connected to the metal wiring of the wiring structure.

6. The semiconductor device of claim 1,
wherein the semiconductor device comprises a first region overlapping the device region and a second region surrounding the first region, and
wherein the second region has a width in a range of 5 μm to 30 μm.

7. The semiconductor device of claim 1, wherein the insulating material layer comprises an oxide.

8. The semiconductor device of claim 1, wherein the first wave-shaped pattern has a first repetition cycle that is different from a second repetition cycle of the second wave-shaped pattern.

9. The semiconductor device of claim 1, further comprising:
an insulating protective film on the first side surface of the insulating material layer and the side surface of the semiconductor substrate.

10. The semiconductor device of claim 9, wherein the insulating protective film comprises a polymer having a $CF_2$ group.

11. The semiconductor device of claim 1, further comprising:
a first connection pad on the wiring structure and connected to the metal wiring.

12. The semiconductor device of claim 11, further comprising:
a through electrode electrically connected to the device region and penetrating through the semiconductor substrate, a passivation layer on the second surface of the semiconductor substrate, and
a second connection pad on the passivation layer and connected to the through electrode.

13. The semiconductor device of claim 1, wherein the second wave-shaped pattern is continuously formed with the first wave-shaped pattern.

14. The semiconductor device of claim 1,
wherein the wiring structure further comprises a metal pattern that is in physical contact with the second side surface of the insulating material layer, is spaced apart from an upper surface of the dielectric layer.

15. A semiconductor device, comprising:
a semiconductor substrate comprising a first surface and a second surface opposing each other, wherein a device region is on the first surface of the semiconductor substrate;
a wiring structure on the first surface of the semiconductor substrate, and comprising a dielectric layer and a metal wiring in the dielectric layer, wherein the wiring structure is electrically connected to the device region; and
an insulating material layer on a side surface of the wiring structure and extending to an upper region of a side surface of the semiconductor substrate, the insulating material layer having a first side surface provided as an outer surface and a second side surface opposing the first side surface,
wherein the first side surface of the insulating material layer has a first wave-shaped pattern which is repeated in a direction that is perpendicular to the first surface of the semiconductor substrate,
wherein the second side surface of the insulating material layer that is substantially perpendicular to the first surface of the semiconductor substrate has a substantially flat interface with the dielectric layer, and
wherein the wiring structure further comprises a metal pattern that is in physical contact with the second side surface of the insulating material layer, and is spaced apart from an upper surface of the dielectric layer.

16. The semiconductor device of claim 15, wherein the insulating material layer comprises a first material that is different from a second material of the dielectric layer.

17. The semiconductor device of claim 15,
wherein the side surface of the semiconductor substrate has a second wave-shaped pattern which is repeated in the direction perpendicular to the first surface of the semiconductor substrate, and
wherein the first wave-shaped pattern has a first repetition cycle that is different from a second repetition cycle of the second wave-shaped pattern.

18. A semiconductor device, comprising:
a semiconductor substrate comprising a first surface and a second surface opposing each other, and a side surface between the first and second surfaces, wherein a device region is on the first surface of the semiconductor substrate;
a wiring structure on the first surface of the semiconductor substrate, and comprising a dielectric layer and a metal wiring in the dielectric layer, wherein the wiring structure is electrically connected to the device region; and
an insulating material layer on a side surface of the wiring structure and having a substantially flat interface with the dielectric layer, wherein the side surface of the insulating material layer and the side surface of the semiconductor substrate have a wave-shaped pattern which is repeated in a direction that is perpendicular to the first surface of the semiconductor substrate, wherein the semiconductor device comprises a first region overlapping the device region and a second region surrounding the first region in a plan view, wherein the second region comprises the insulating material layer that is on the side surface of the semiconductor substrate, and wherein the second region has a width in a range of 5 µm to 30 µm.

19. The semiconductor device of claim 18, further comprising:

an insulating protective film on the side surface of the insulating material layer and the side surface of the semiconductor substrate, wherein the insulating protective film comprises a polymer.

* * * * *